(12) United States Patent
Raghavan et al.

(10) Patent No.: US 7,301,836 B1
(45) Date of Patent: Nov. 27, 2007

(54) FEATURE CONTROL CIRCUITRY FOR TESTING INTEGRATED CIRCUITS

(75) Inventors: Dhananjay Srinivasa Raghavan, Mountain View, CA (US); Paul J. Tracy, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 177 days.

(21) Appl. No.: 11/257,861

(22) Filed: Oct. 25, 2005

(51) Int. Cl.
*G11C 29/00* (2006.01)
*G11C 7/00* (2006.01)

(52) U.S. Cl. ............ 365/201; 365/189.11; 365/189.12; 714/727

(58) Field of Classification Search ................. 365/201, 365/189.11, 189.12; 714/724, 726, 727
See application file for complete search history.

(56) References Cited

U.S. PATENT DOCUMENTS

| | | | |
|---|---|---|---|
| 6,215,689 B1* | 4/2001 | Chhor et al. ................... | 365/63 |
| 6,851,079 B1 | 2/2005 | Hergott | |
| 6,885,963 B2 | 4/2005 | Arnold et al. | |
| 6,886,121 B2 | 4/2005 | Dervisoglu et al. | |
| 6,886,122 B1* | 4/2005 | Barthel ....................... | 714/727 |
| 6,920,627 B2 | 7/2005 | Blodget et al. | |
| 6,928,606 B2 | 8/2005 | Savaria et al. | |
| 6,934,898 B1 | 8/2005 | Goff | |
| 6,959,428 B2 | 10/2005 | Broberg, III et al. | |
| 2004/0264227 A1* | 12/2004 | Kojima et al. ................ | 365/45 |
| 2006/0179373 A1* | 8/2006 | Ishikawa ..................... | 714/727 |

* cited by examiner

*Primary Examiner*—Son Dinh
*Assistant Examiner*—Toan Le
(74) *Attorney, Agent, or Firm*—G. Victor Treyz

(57) ABSTRACT

An integrated circuit is provided that includes testing circuitry for testing input-output circuits. The integrated circuit contains input-output circuits that each have associated input-output pins and input and output buffers. Each input-output circuit has associated features such as a weak pull-up feature, a voltage clamp diode feature, a bus hold feature, an open-drain feature, a differential input termination resistance feature, and a single-ended/differential mode selection feature. An input-output feature control register receives input-output circuit feature selection instructions. The feature selection instructions contain feature selection bits whose values determine which of the input-output circuit features are enabled in a set of input-output circuits for testing on the integrated circuit. The feature selection instructions can selectively enable one or more input-output circuit features in each input-output circuit. Different feature selection instructions can be loaded into the feature control register to systematically test the input-output circuit features.

20 Claims, 13 Drawing Sheets

FEATURE CONTROL CIRCUITRY FOR TESTING INTEGRATED CIRCUITS

BACKGROUND

This invention relates to circuit testing, and more particularly, to testing input-output circuit features on integrated circuits.

The process of designing and testing modern custom integrated circuits is complex and expensive. Custom circuits, which are sometimes referred to as application-specific integrated circuits (ASICs), offer high performance, but can be costly to produce. Not only must a circuit be designed, but the lithographic mask sets that are used to fabricate the circuit in mass production must be designed and debugged.

Because of the large amount of effort involved in creating custom integrated circuits, it is generally only cost effective to develop a custom integrated circuit when a chip is needed in large volumes. Projects requiring smaller volumes of circuits are often implemented using programmable logic devices.

Programmable logic devices are a type of integrated circuit that can be customized in relatively small batches to implement a desired logic design. In a typical scenario, a programmable logic device manufacturer designs and manufactures uncustomized programmable logic device integrated circuits in advance. Later, a logic designer uses a logic design system to design a custom logic circuit. The logic design system uses information on the hardware capabilities of the manufacturer's programmable logic devices to help the designer implement the logic circuit using the resources available on a given programmable logic device.

The logic design system creates configuration data based on the logic designer's custom design. When the configuration data is loaded into one of the programmable logic devices, it programs the logic of that programmable logic device so that the programmable logic device implements the designer's logic circuit. The use of programmable logic devices in place of ASICs can drastically reduce the amount of effort required to produce a circuit.

To reduce costs and maximize performance when high volumes of programmable logic devices are required, programmable logic device manufacturers generally offer programmable logic devices that can be programmed using lithographic masks. The masks used for mask programming a mask-programmable logic device are much simpler than the lithographic mask sets used in ASICs. For example, a single mask layer might be sufficient to program a mask-programmable device (e.g., by forming a desired pattern of via contacts in a via array).

Because mask-programmed programmable logic devices offer much of the performance and cost benefits of ASICs, they are sometimes referred to as structured ASICs.

The process of implementing a complex circuit design in an electrically-programmed or mask-programmed programmable logic device typically requires testing. Testing can be performed by a manufacturer or by a logic designer.

Testing operations can involve the testing of logic circuitry in the programmable logic device core and the testing of input-output circuits. Input-output circuits generally contain a number of components such as pull-up resistors and clamp diode circuits that are used to provide special input-output circuit features (i.e., a voltage pull-up feature, an over-voltage protection feature, etc.).

The components in an input-output circuit are often interdependent, which makes testing difficult. For example, one cannot test clamp diode by applying an over-voltage if a pull-up circuit is present. With electrically-programmable programmable logic devices, it is possible to test these features independently, by selectively enabling and disabling various features in a series of tests. With mask-programmed programmable logic device integrated circuits, however, this flexibility is not available. Once a circuit is designed, the mask for that circuit creates a pattern of fixed connections in the circuit. The mask is fixed, so the circuit cannot be reconfigured multiple times to perform a series of tests.

Because it is not possible to achieve comprehensive structural test coverage for input-output circuits by varying the programming mask, conventional mask-programmed programmable logic devices have been provided with special test control circuitry. The test control circuitry is controlled by applying appropriate test control signals during testing. By varying the test control signals, the functionality of the circuit can be changed and various input-output circuit features can be tested successfully.

To avoid the need to provide extra pins, the test control signals are applied to the test control circuitry through pins that would otherwise serve as regular input-output pins for the device. This type of arrangement leads to a number of conflicts. For example, when a pin is being used as a test control pin, its voltage may be held at a particular value. When a pin is maintained at a constant voltage level, it is not possible to sense the voltage level on that pin as part of a test. This problem is exacerbated by conventional testing methodologies, which generally require that many test pins be maintained at appropriate fixed values, even if they are not actively being used to control a particular test.

These types of limitations preclude comprehensive structural testing of input-output circuits on a mask-programmed programmable logic device integrated circuit. Structural testing of input-output circuits on other types of integrated circuits can be equally difficult.

It would therefore be desirable to provide improved ways in which to test input-output circuits on integrated circuits.

SUMMARY

The present invention allows input-output circuit features to be tested comprehensively. In particular, the invention allows input-output circuit features on mask-programmed integrated circuit devices to be tested comprehensively. Mask-programmed integrated circuits are configured using lithographic masks to implement custom logic designs. Input-output circuits on the mask-programmed devices have features that are selectively enabled by associated mask-programmed programmable elements. The features include features such as a pull-up resistance feature, a voltage clamp feature, a single-ended/differential feature, a differential input resistance feature, a bus hold feature, and an open-drain feature. In a given input-output circuit, the states of the programmable elements determine whether each feature is turned on or off (i.e., whether the feature has been implemented or not in that input-output circuit).

To decouple features from each other to allow effective structural testing, the mask-programmable integrated circuits of the present invention are loaded with feature selection instructions. The feature selection instructions may be loaded into an input-output circuit feature control register. The outputs of the feature control register serve to globally control which features are active. For example, a feature selection instruction might be loaded into the input-output circuit feature control register that contains a high pull-up feature selection bit. The high value of this bit will globally enable the pull-up feature. By globally enabling the pull-up feature in this way, those input-output circuits in which the pull-up feature has been implemented may be tested.

Different instructions may be loaded in series, to allow systematic and comprehensive input-output feature testing. The enabled input-output features may be tested using boundary scan techniques. Boundary scan testing may be performed using Joint Test Action Group (JTAG) standards or other suitable arrangements.

These testing arrangements may be used on mask-programmed programmable logic device integrated circuits or any other suitable type of integrated circuit.

Further features of the invention, its nature and various advantages will be more apparent from the accompanying drawings and the following detailed description of the preferred embodiments.

DETAILED DESCRIPTION

The present invention relates to testing integrated circuits. The integrated circuits being tested may be any suitable integrated circuits such as microprocessors, digital signal processors, application-specific integrated circuits, programmable logic device integrated circuits such as mask-programmable integrated circuits, etc. As a particular example, the invention is sometimes described in the context of mask-programmed integrated circuits having test circuitry for facilitating comprehensive structural testing of input-output circuits. Aspects of the invention that relate to systems and methods for testing integrated circuits are also described.

The integrated circuits being tested in accordance with the invention are generally referred to as mask-programmed programmable logic devices or structured ASICs (application specific integrated circuits). The invention also applies to the testing of integrated circuits with no programming capabilities and to programmable integrated circuits with programmable capabilities that might not typically be referred to as programmable logic devices. Programmable integrated circuits may include, for example, application specific integrated circuits with regions of mask-programmable logic, digital signal processors containing mask-programmable logic, microprocessors or microcontrollers with mask-programmable logic regions, etc. These mask-programmable devices are sometimes referred to herein as mask-programmed programmable logic device integrated circuits, mask-programmed devices, and mask-programmed integrated circuits.

Figure 1:
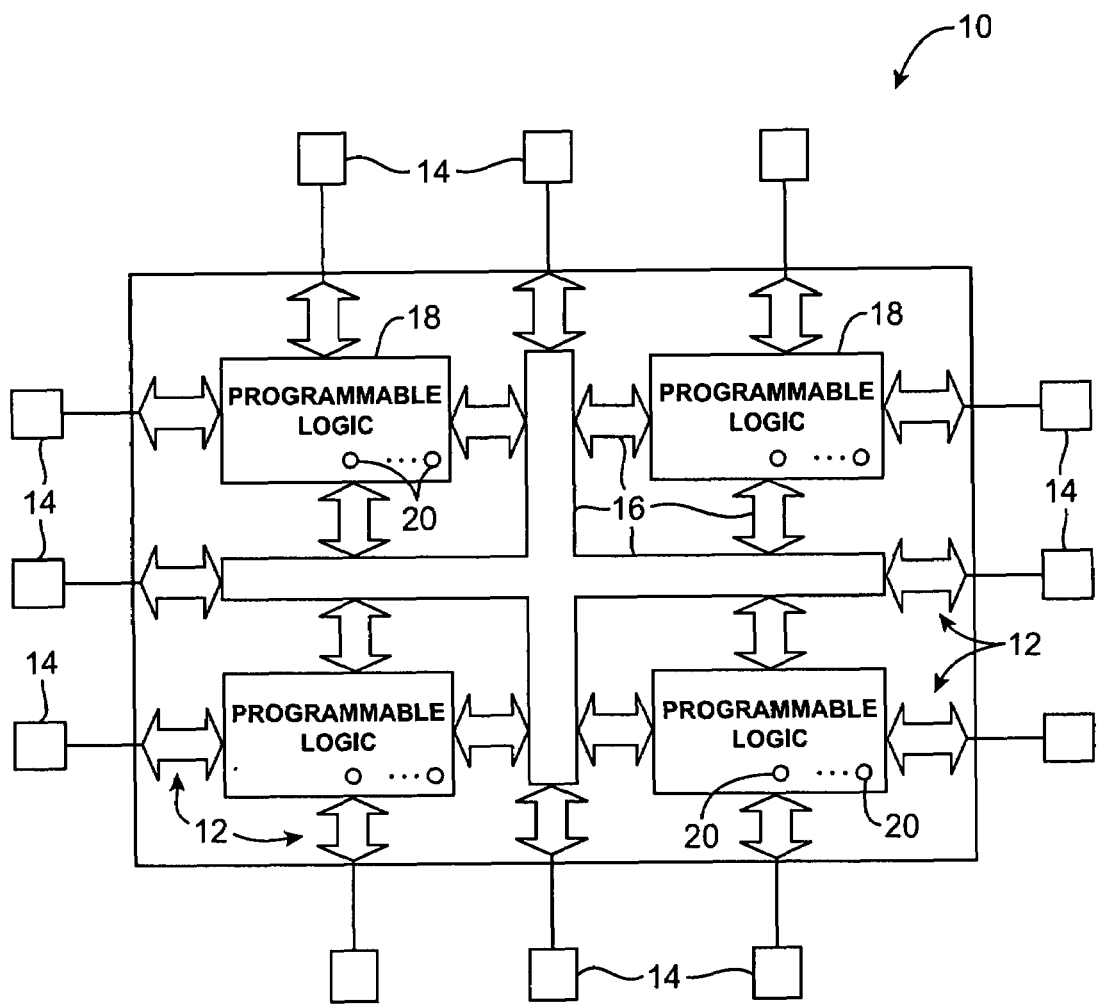
FIG. 1 is a diagram of an illustrative programmable logic device integrated circuit in accordance with the present invention.

An illustrative integrated circuit 10 which may be tested in accordance with the invention is shown in FIG. 1. The integrated circuit 10 in FIG. 1 is a programmable logic device integrated circuit, but the invention applies to any suitable integrated circuit having input-output circuits to be tested. The invention is described in the context of the programmable logic device integrated circuit 10 of FIG. 1 as an example. The diagram of FIG. 1 is used to depict both electrically-programmable and mask-programmable devices.

As shown in FIG. 1, programmable logic device 10 may have input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

In general, programmable logic devices such as programmable logic device 10 may be electrically programmed or mask programmed. With electrical programming techniques, programming (configuration) data is loaded into programmable elements 20 using pins 14 and input/output circuitry 12. Electrically-programmed elements 20 may, as an example, be based on random-access memory (RAM) cells. With mask-programming techniques, a lithographic mask (or masks) is developed that contains the programming data necessary for programming the device 10. Programming masks for mask-programmed devices are generally much simpler and use more regular patterns than the lithographic masks used to fabricate custom integrated circuits. For example, a typical programming mask might define a pattern of via holes to be formed in an array of possible via hole locations. If a hole is not formed, a corresponding via is not formed. If a hole is formed, a via connects the metal lines of two different metallization layers in the dielectric stack of the device. Other mask-programming arrangements may be used if desired.

Regardless of whether programmable elements 20 are configured by electrically loading programming data or by mask programming during device fabrication, the configured programmable elements 20 each provide a control output signal that controls the state of an associated logic component in programmable logic 18. The configured elements may provide static control signals that are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18 to customize its functions. The circuit elements may be transistors such as pass transistors or parts of multiplexers, look-up tables, logic arrays, AND, OR, NAND, and NOR logic gates, etc.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines that interconnect certain logic regions with other logic regions in a given area, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

In some logic devices 10, the larger portions of logic may be referred to as "logic array blocks" (LABs) and the smaller portions of logic may be referred to as logic elements (LEs). This is merely one illustrative logic device arrangement 10. In general, the logic of device 10 may be provided using any suitable programmable logic device architecture.

Devices such as device 10 of FIG. 1 typically contain numerous input-output pins 14. A device may, for example, contain more than 100 input-output pins 14. Some of the input-output pins may be configured to operate as input pins, whereas other input-output pins may be configured to operate as output pins. The input-output circuitry 12 that is associated with each input-output pin 14 is sometimes referred to as an input-output circuit or an input-output buffer. Input-output circuits such as these may, in general, support either single-ended or differential data signaling schemes. Single-ended input-output circuits have at least one associated input-output pin that is referenced to ground. Differential input-output circuits have two pins that are referenced to each other.

The input-output circuits on the programmable logic device 10 have associated programmable elements 20. The programmable elements of each input-output circuit can be configured to customize the operation of that input-output circuit. Customizable input-output functions such as these are often referred to as input-output features. The present invention allows these features to be comprehensively tested in mask-programmed devices.

Figure 2:
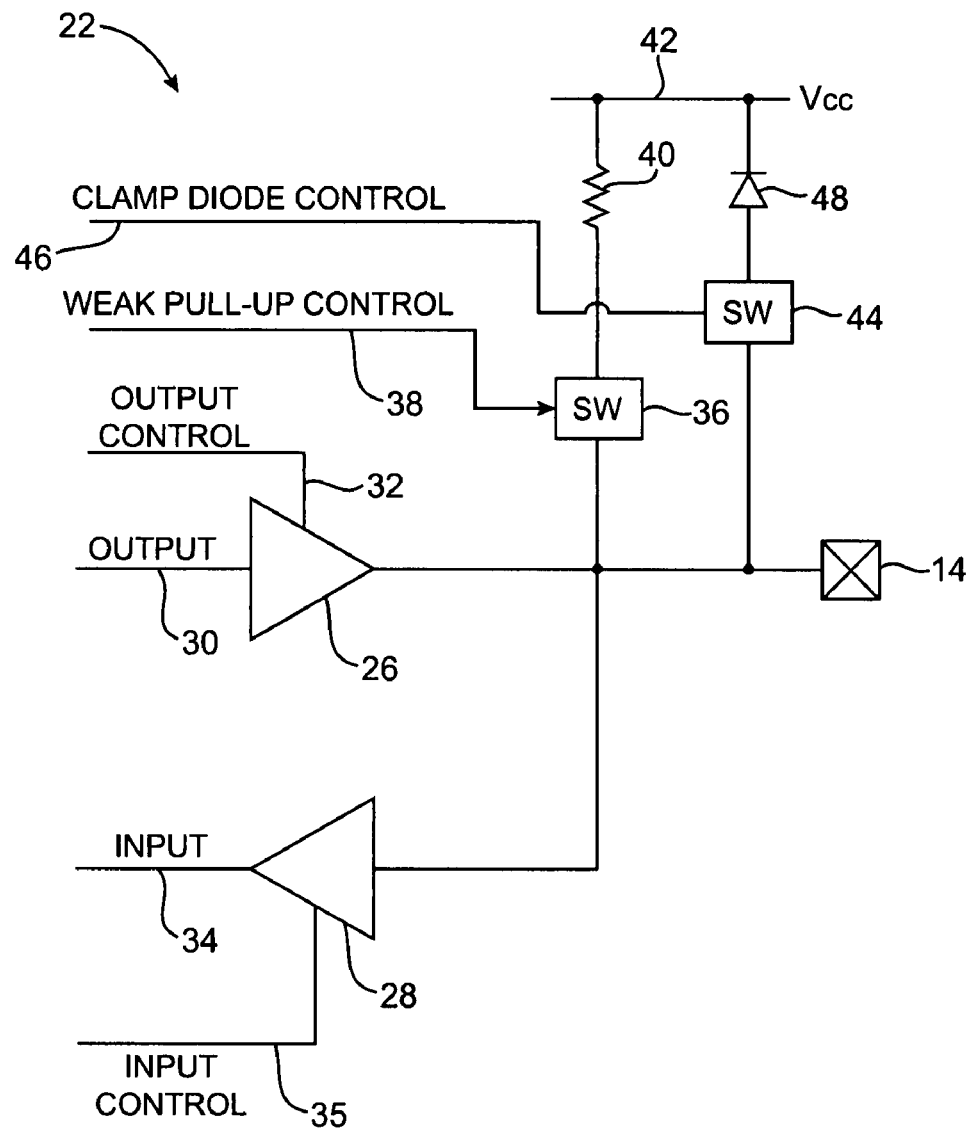
FIG. 2 is a diagram of an illustrative programmable logic device integrated circuit input-output circuit having a pull-up feature and a diode voltage clamp feature in accordance with the present invention.

An illustrative programmable logic device input-output circuit 22 is shown in FIG. 2. Circuit 22 has an associated input-output pin 14. In a typical programmable logic device 10, there are numerous input-output circuits 22, each having a corresponding input-output pin 14. Pins such as pin 14 may be any suitable input-output terminals such as solder-bump pads or wire bonding pads connected to package pins or other package conductors that in turn are connected to circuit boards or other system components.

The input-output circuit 22 of FIG. 2 has two associated input-output features—a pull-up resistor feature and a diode clamp feature. This is merely illustrative. In general, input-output circuits on the programmable logic device 10 may have any suitable number of associated input-output circuit features.

Input-output circuit 22 has an output buffer 26 and an input buffer 28. Output signals from core logic (not shown) are provided to buffer 26 at output line 30. Output control line 32 is used to control the operation of buffer 26. When control line 32 has one state, buffer 26 is enabled so that its output follows its input. When control line 32 has another state, buffer 26 is tristated (disabled), so that its output floats. Input signals for device 10 that are received from external circuitry through pin 14 are provided to the core logic of device 10 via input buffer 28 and associated input line 34. Input buffer enable 35 controls input buffer 28.

The pull-up feature of input-output circuit 22 is implemented using pull-up resistor 40. Pull-up resistor 40 is connected to a positive power supply voltage 42 (called Vcc in this example). Switch 36 is used to control whether the pull-up feature is enabled. The state of switch 36 is controlled by the control signals on control line 38. When switch 36 is open, the pull-up feature is disabled. When switch 36 is closed, resistor 40 provides a pull-up path between input-output pin 14 and positive power supply voltage 42. The resistor 40 is typically large, so the pull-up effect is relatively weak. In the absence of a defined voltage level on pin 14, the weak pull-up effect pulls the voltage on pin 14 to Vcc (i.e., a logic high signal).

The voltage clamp feature of the present invention prevents excess voltages from developing on pin 14. Switch 44 is used to selectively enable the voltage clamp feature. When the clamp diode control signal on control path 46 has one state, switch 44 is open and the diode voltage clamp feature is disabled. When the clamp diode control signal on control path 46 has another state, switch 44 is closed and the diode voltage clamp feature is enabled. With switch 44 closed, over-voltages are prevented from developing on pin 14. If the voltage on pin 14 becomes too large, diode 48 will turn on. This will pull the voltage on pin 14 towards the Vcc voltage level produced on power supply line 42. Diode 48 is sometimes referred to as a PCI diode, because over-voltage protection of the type provided using diode 48 is specified by the PCI communications standard.

Figure 3:
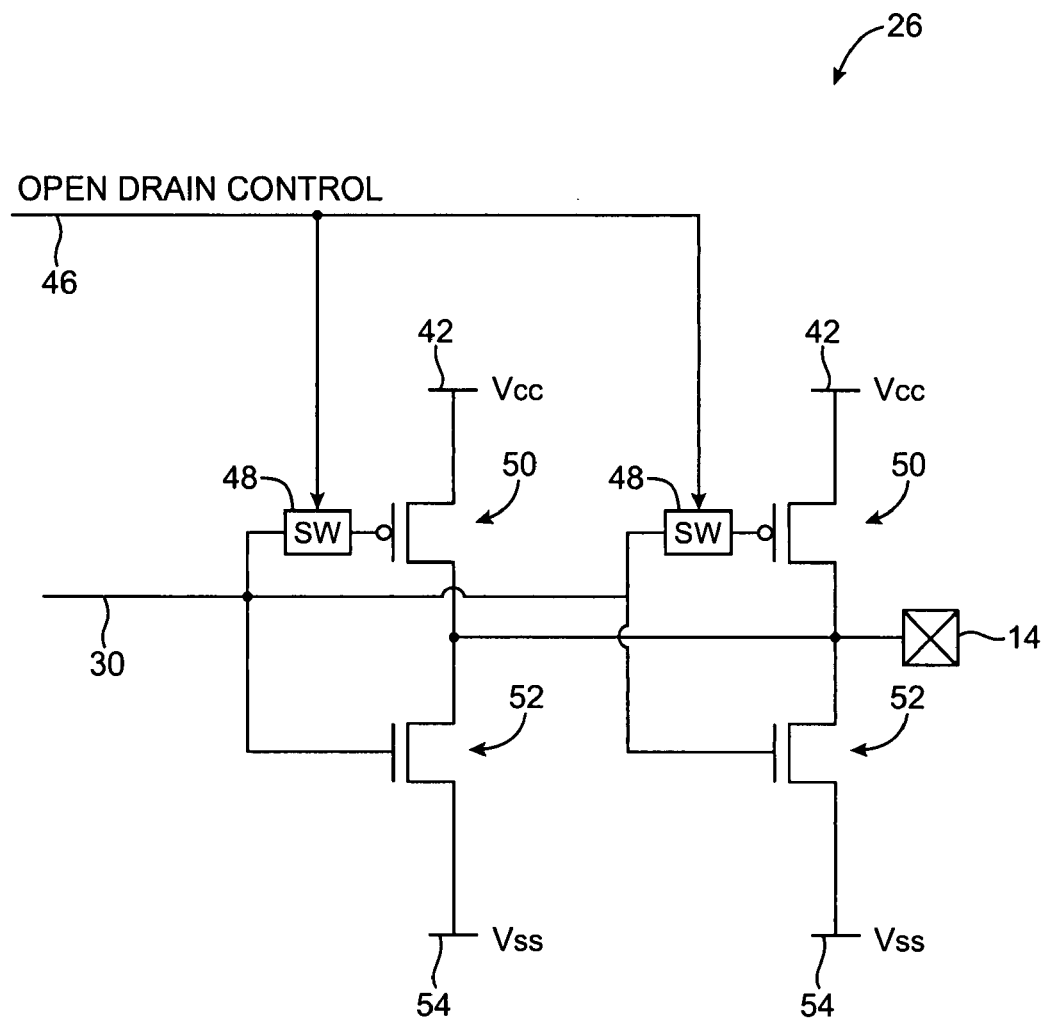
FIG. 3 is a diagram of an illustrative programmable logic device integrated circuit input-output circuit having an open drain feature in accordance with the present invention.

Another input-output circuit feature that input-output circuit 22 may have is the so-called open-drain feature. An illustrative output buffer 26 with open drain control is shown in FIG. 3. Output buffer 26 is powered by a positive voltage Vcc on positive power supply voltage terminal 42 and a ground voltage Vss (e.g., 0 volts) on ground terminal 54. Output signals received on line 30 are provided to pin 14. Buffer 26 has p-channel metal-oxide-semiconductor (PMOS) transistors 50 and n-channel metal-oxide-semiconductor (NMOS) transistors 52. Switches 48 control whether the PMOS transistors 50 are enabled or disabled. The state of the open drain control signal on control line 46 controls switches 48. When switches 48 are closed, the open-drain feature is disabled and the gates of transistors 50 respond to the signals on line 30. When switches 48 are open, the PMOS transistors 50 are disconnected and the open-drain feature is enabled. In this situation, a weak pull up on the output (e.g., a pull-up of the type described in connection with FIG. 2) will cause the output on pin 14 to rise to a logic high value in the absence of a driving signal on pin 14. If, however, an input signal is received on pin 14 from an external component, the state of that input signal will override the logic high value. This type of functionality is used in polling applications.

Two other input-output features that an input-output circuit 22 may have relate to single-ended versus differential mode and input termination resistance. An illustrative input-output circuit 22 having selectable single-ended/differential and termination resistance features is shown in FIG. 4.

Figure 4:
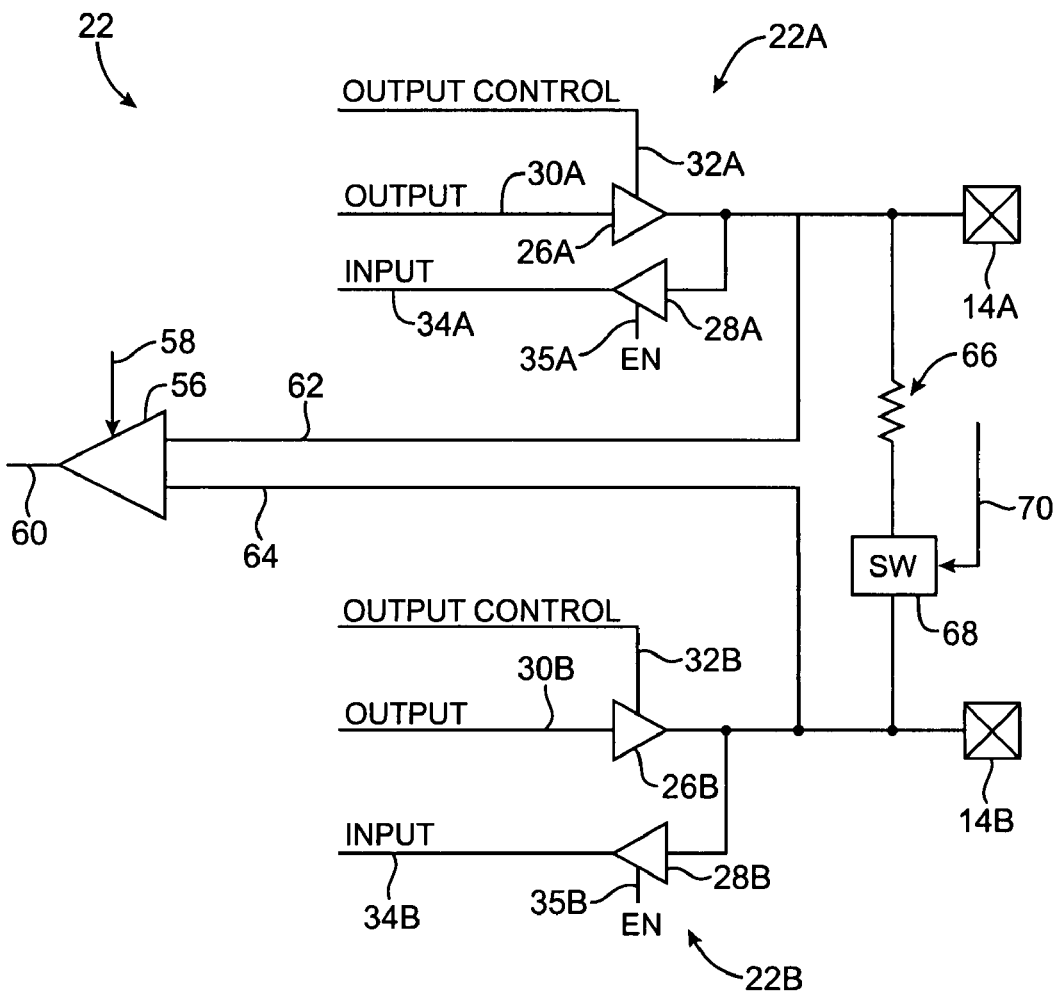
FIG. 4 is a diagram of an illustrative programmable logic device integrated circuit input-output circuit having a termination resistance feature in accordance with the present invention.

Input-output circuit 22 of FIG. 4 has two input-output pins 14A and 14B and two corresponding circuits 22A and 22B. Circuit 22A has an output buffer 26A that can be used to drive output signals from output line 30A to pin 14A when buffer 26A is enabled by output control line 32A. Input signals from pin 14A may be driven onto line 34A by input buffer 28A when input buffer 28A is enabled by an enable signal on enable control line 35A. Similarly, circuit 22B has an output buffer 26B that can be used to drive output signals from output line 30B to pin 14B. Buffer 26B is enabled and disabled using output control line 32B. Input signals from pin 14B may be driven onto line 34B by input buffer 28B. Input buffer 28B has an enable input 35B that is used to enable and disable buffer 28B as desired.

Buffers 28A and 28B are singled ended buffers that handle signals that are referenced to ground. When input-output circuit 22 is placed in single-ended mode, circuit 22A handles single-ended signals for pin 14A and circuit 22B handles single-ended signals for pin 14B.

Input-output circuit 22 of FIG. 4 also has a differential input buffer 56, which is controlled by control line 58. Differential input buffer 56 receives differential signals from pins 14A and 14B using differential input lines 62 and 64, respectively. Differential signals are referenced to each other, rather than to ground, and are often used in high-speed communications. The differential input buffer 56 converts the data received on differential input lines 62 and 64 into a single-ended signal on output 60.

Using the control inputs for the single-ended and differential buffers in input-output circuit 22, input-output circuit 22 may be configured to operate in single-ended or differential mode, as needed. For example, circuit 22 can be placed in a differential input mode by disabling all buffers except differential input buffer 56. As another example, circuit 22 can be placed in a single-ended input mode in which circuits 22A and 22B each function as a single-ended input buffer by enabling input buffers 28A and 28B and disabling buffers 26A, 26B, and 56. Input-output circuits such as input-output circuit 22 of FIG. 4 that can be selectively configured to operate in single-ended and differential signaling modes are said to have the single-ended/differential feature. In general, an input-output circuit of the type shown in FIG. 4 can be configured in a number of different ways (e.g., for supporting simultaneous single-ended input and output, single-ended output only, single-ended input only, and differential input only).

Input-output circuit 22 of FIG. 4 also has a termination resistance feature. Switch 68 is controlled by control line 70. When the control signal on control line 70 has one state, switch 68 is closed and termination resistance 66 is electrically connected between pin 14A and pin 14B. In this mode the termination resistance is switched into use (i.e., the input-output circuit termination resistance feature is enabled). When the control signal on control line 70 has another state, switch 68 is open and termination resistance 66 is disconnected (i.e., pins 14A and 14B are not electrically connected and the input-output circuit termination resistance feature is disabled).

Figure 5:
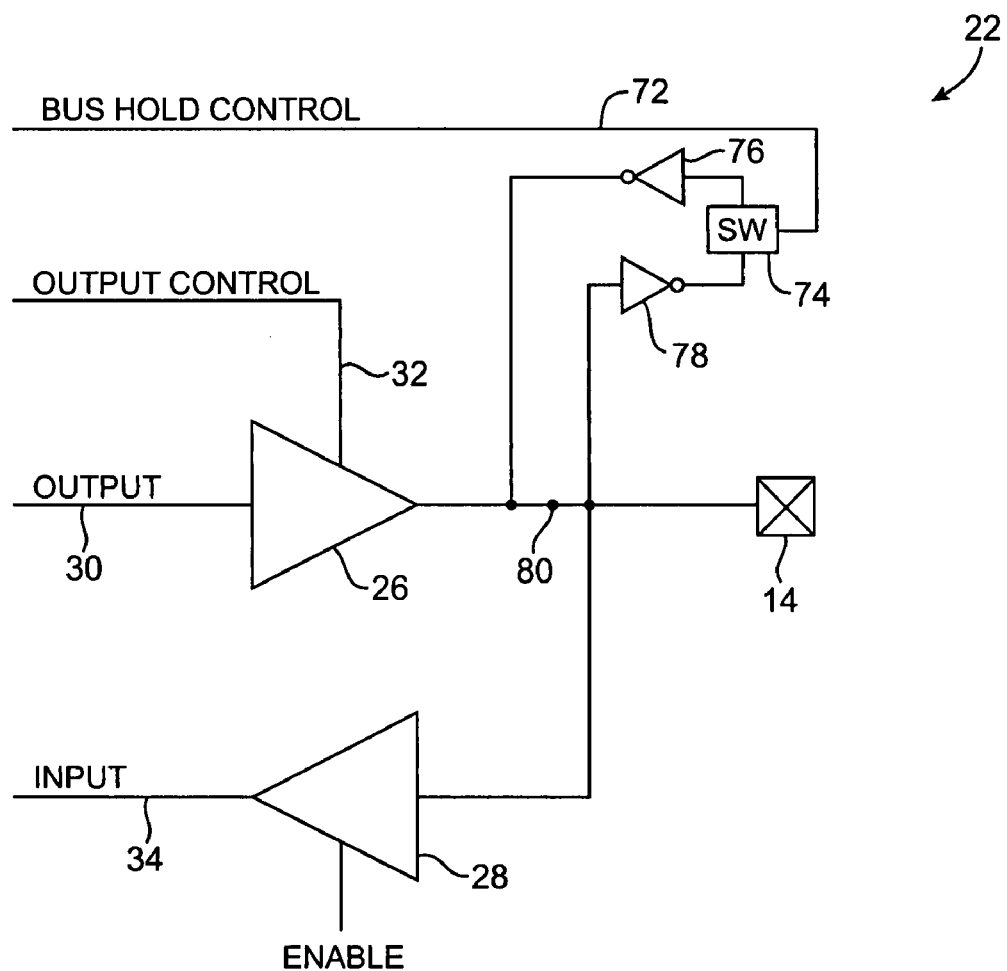
FIG. 5 is a diagram of an illustrative programmable logic device integrated circuit input-output circuit having a bus hold feature in accordance with the present invention.

Another input-output circuit feature that an input-output circuit may have is the so-called bus hold feature. An input-output circuit 22 with the bus hold feature is shown in FIG. 5. Bus hold control line 72 controls switch 74. When switch 74 is closed, the bus hold feature is enabled. When switch 74 is open, the bus hold feature is disabled. Cross-coupled buffers 76 and 78 form a storage element (weak latch) when switch 74 is closed. In this situation, the current signal on node 80 is captured (held) by the latch behavior of cross-coupled buffers 76 and 78 when output buffer is tristated using output control 32.

In an electrically-programmed programmable logic device, input-output circuit features such as the input-output circuit features described in connection with FIGS. 2-5 can be tested methodically by loading a series of different test configuration data files into the programmable logic device during testing. Each set of test configuration data that is loaded into the programmable logic device in this way enables a different input-output circuit feature. After configuring the device as desired to enable a particular input-output circuit feature, a set of test vectors is applied to the device. The response of the circuit to the test vectors is then measured by monitoring the signals that appear on the output pins of the circuit and by examining the contents of special test registers called boundary scan registers. Because each set of test configuration data selectively enables only certain selected input-output circuit features, the input-output features do not interfere with each other during testing.

Figure 6:
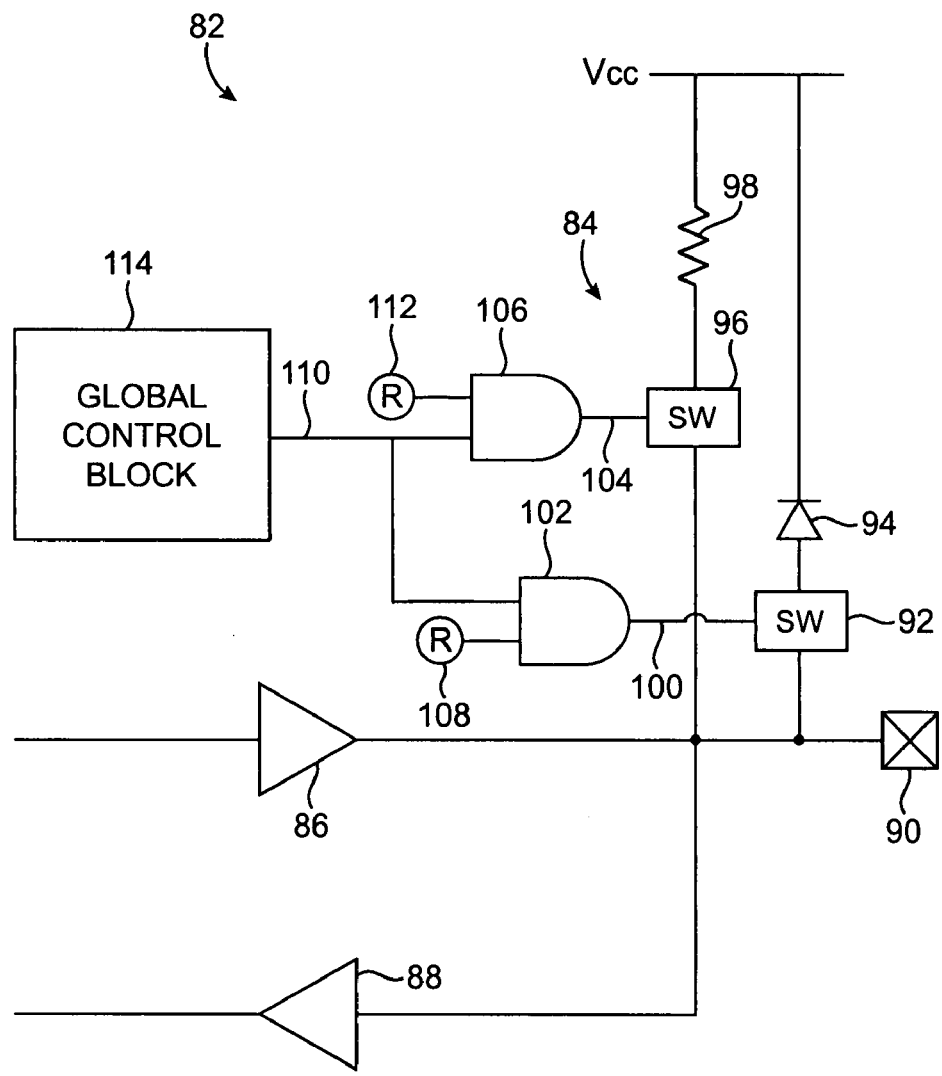
FIG. 6 is a diagram of a conventional input-output circuit in an electrically-programmable programmable logic device integrated circuit.

As an example, consider the electrically-programmed programmable logic device arrangement of FIG. 6. The circuitry 82 of FIG. 6 contains an input-output circuit 84 having a pull-up feature and a diode voltage clamp feature of the types described in connection with FIG. 2. Input-output pin 90 is used as an input or output for the device. Input signals are handled by input buffer 88. Output buffer 86 handles output signals. Global control block 114 handles power-up operations and is responsible for turning on all input-output circuitry and other circuitry on the device.

Conventional electrically-programmable programmable logic devices can generally be operated in two modes—user mode and test mode. The device is placed in user mode during normal operation in a system. Test mode is used for testing a subset of the circuitry of the device. The remainder of the device circuitry can be tested in user mode.

Global control block 114 handles control operations related to mode transitions (e.g., enabling and disabling various components on the device). After power-up, global control block 114 applies a logic high signal to control line 110 (in both user mode and test mode).

Circuit 82 uses AND gates 106 and 102 to control how the high signal on line 110 is applied to the switches 96 and 92. The AND gates 106 and 102 each have one input that is connected to control line 110. The other input of each AND gate is connected to a respective programmable element. Programmable element 112 provides its output to the input of AND gate 106. Programmable element 108 provides its output to the input of AND gate 102. During testing, the programmable elements on the programmable logic device are loaded with test configuration data. Different sets of test configuration data are loaded at different times during a test. For example, one set of test configuration data may include a "1" for element 112 and a "0" for element 108 and another set of test configuration data may include a "0" for element 112 and a "1" for element 108.

The AND gates 106 and 102 selectively apply the output signal on line 110 to switches 96 and 92 depending on the states of the signals received from their respective programmable elements 112 and 108.

When it is desired to enable the pull-up feature, test configuration data is loaded into the device that places a "1" in element 112 and a "0" in element 108. With the "1" applied to its input, AND gate 106 allows the high signal ("1") on line 110 to pass to switch 96 via line 104. This closes switch 96 and connects pull-up resistor 98 to input-output pin 90. Because a "0" has been loaded into element 108, the high signal on line 110 is prevented from passing to line 100 by AND gate 102, so switch 92 remains open. In this configuration, the pull-up feature is enabled and the clamp diode feature is disabled. This allows the pull-up feature to be tested by tristating output buffer 86 and monitoring pin 90 to determine whether the voltage on pin 90 is pulled up to Vcc as expected.

When it is desired to enable the clamp diode feature, test configuration data is loaded into the device that places a "0" in element 112 and a "1" in element 108. With the "1" applied to its input, AND gate 102 allows the high signal ("1") on line 110 to pass to switch 92 via line 100. This closes switch 92 and connects diode 94 to input-output pin 90 to provide over-voltage protection. Because a "0" has been loaded into element 112, the high signal on line 110 is prevented from passing to line 104 by AND gate 106, so switch 96 is open. In this configuration, the pull-up feature is disabled and the clamp diode feature is enabled. The clamp diode feature can therefore be tested without interference from the pull-up circuit.

As this example demonstrates, comprehensive structural testing of input-output circuits in electrically-programmable programmable logic devices can be performed by selective loading of various sets of test configuration data.

Figure 7:
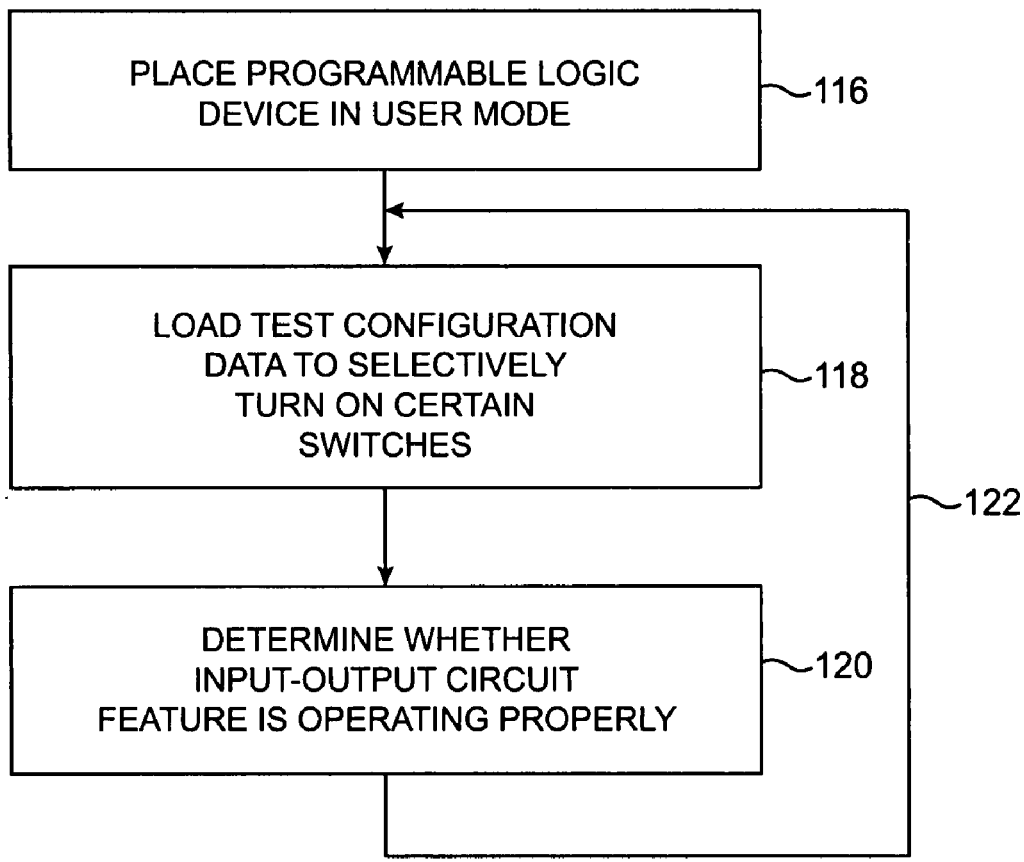
FIG. 7 is a flow chart of a conventional technique for testing input-output circuits of the type shown in FIG. 6 on a conventional electrically-programmable programmable logic device integrated circuit.

A flow chart of the steps involved in the conventional testing of electrically-programmable programmable logic devices is shown in FIG. 7. At step 116, the programmable device is placed in user mode. Global control block 114 of FIG. 6 generates a logic high ("1") at its output 110. This output signal is gated by AND gates such as gates 106 and 108. The operation of gates 106 and 108 is controlled by configuration data loaded into elements such as elements 112 and 108 of FIG. 6.

At step 118 of FIG. 7, test configuration data is loaded into the programmable elements such as elements 112 and 108. The data selectively turns on and turns of various gates such as gates 106 and 102 of FIG. 6, which in turn enables and disables circuits such as the circuits shown schematically by switches 96 and 92 of FIG. 6. The states of the switches dictate which input-output features are enabled for testing.

At step 120, the enabled input-output features are tested (e.g., by capturing signals using boundary scan registers in response to test vectors applied to the circuit).

The process is generally repeated as shown by line 112. During each cycle of the process, a different set of test configuration data may be loaded into the device, which allows a tester to systematically test various input-output circuit features without interference from the operations of other input-output circuit features.

Mask-programmed programmable logic devices cannot be tested in this way, because it is not possible to repetitively load different sets of test configuration data into a mask-programmed device. Once a given mask-programmed programmable logic device has been fabricated, its configuration is fixed. It is not possible to selectively isolate features during testing by varying the states of the device's programmable elements.

Figure 8:
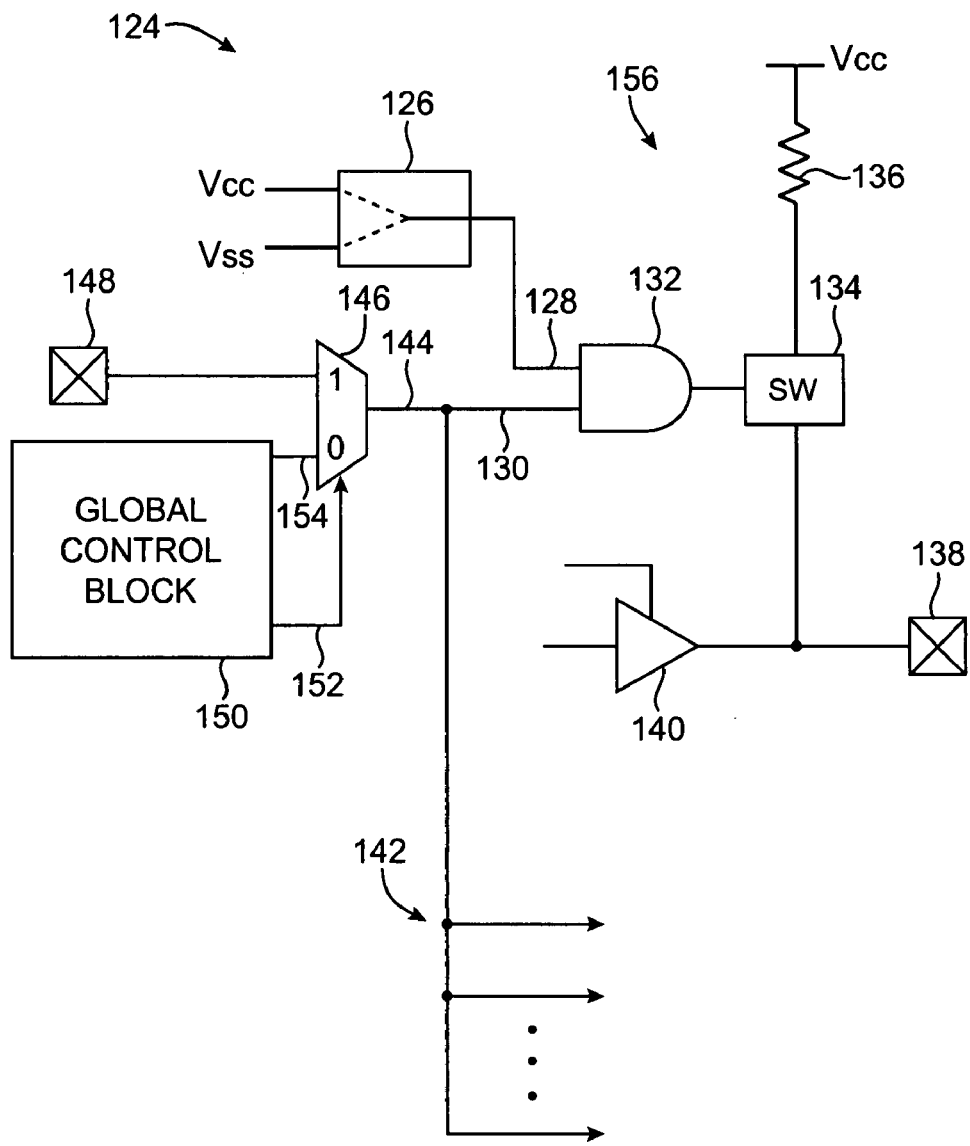
FIG. 8 is a diagram of a conventional input-output circuit on a mask-programmable programmable logic device integrated circuit.

To address this problem, certain input-output pins are used as test control pins during testing of conventional mask-programmed devices. A typical arrangement is shown in FIG. 8. The mask-programmed device 124 of FIG. 8 has a global control block 150. As described in connection with global control block 114 of FIG. 6, global control block 150 handles power-up operations and mode transitions and produces a logic high signal on output line 154 during user mode and test mode. Control block 150 also produces control signals on lines such a test mode control line 152 to control associated multiplexers 146.

The state of test mode control line 152 is "0" during user mode and "1" during test mode. When it is desired to use an input-output pin such as pin 148 as a test control pin, the device is place in test mode, so the multiplexer 146 that is associated with that input-output pin is provided with a "1" at its control input via its line 152. This routes the input of multiplexer 146 that is connected to the pin 148 to output 144.

When multiplexer 146 has been configured in this way, the signals applied to pin 148 can be used as test control signals. The test control signals from pin 148 are routed through multiplexer 146 and are applied to input 130 of AND gate 132. The other input 128 of AND gate 132 is connected to the output of mask-programmed element 126. In a typical mask-programmed programmable logic device there are numerous input-output circuits 156, each having an associated input output pin 138 and associated buffer circuitry such as output buffer 140. There are also numerous mask-programmed elements 126. Depending on the programming mask used during fabrication of the device, the mask-programmed element 126 in a given input-output circuit 156 might be configured to provide a high ("1") output at Vcc or might be configured to provide a low ("0") output at Vss. Once programmed during fabrication, the states of elements such as element 126 cannot be changed to facilitate testing.

Consider the situation in which the output of element 126 of FIG. 8 is high. The high output of element 126 is applied to input 128 of AND gate 132. With this input high, the signal on line 130 (i.e., the test control signal from pin 148) is applied to switch 134. Switch 134 (in this example) is used to enable or disable the pull-up feature. When switch 134 is closed in response to receiving a high test control signal from pin 148, pull-up resistor 136 is connected between input-output pin 138 and Vcc. When switch 134 is open, the pull-up resistor 136 is disconnected.

As illustrated schematically by line 144 and lines 142 (which are sometimes referred to as feature control lines), the test control signal from input output pin 148 and multiplexer 146 can be distributed to numerous input-output circuits 156 on the device. Only one circuit 156 is shown in FIG. 8 to avoid over-complicating the drawing.

The conventional arrangement of FIG. 8 allows some of the input-output circuit features of a conventional mask-programmed programmable logic device to be tested. To avoid conflicts between input-output features, testing can be performed in test mode. In test mode, global control block 150 produces a logic high signal on test mode control line 152, which switches multiplexers such as multiplexer 146 so that input-output pins 148 can be used as test control pins.

In the example of FIG. 8, there is only one multiplexer 146. In general, there are multiple multiplexers, each of which is associated with a different input-output pin serving as a test control pin and each of which is associated with a different input-output circuit feature.

The differential input buffers such as buffer 56 of FIG. 4 are turned off during test mode to avoid creating undesired circuit paths during testing. The open-drain switches in each output buffer are opened to turn the open-drain feature off. This allows the test pin outputs to respond properly during the test. Pins such as pin 148 are being used as inputs, so during testing the output buffers that would otherwise be available to drive signals onto pins such as pin 148 are disabled.

Boundary scan registers (sometimes called scan chain registers or scan chains) are used to apply test signals during testing and are used to capture test results. Test signals are loaded into boundary scan registers serially. Test results are also unloaded serially. When a conventional mask-programmed device is placed into test mode, the routing path from the input buffer used for the scan chain is connected to the scan chain's first cell so that data can be loaded (e.g., via a test data in or "TDI" input pin). The output buffer for the test data out pin "TDO" is also enabled.

Figure 9:
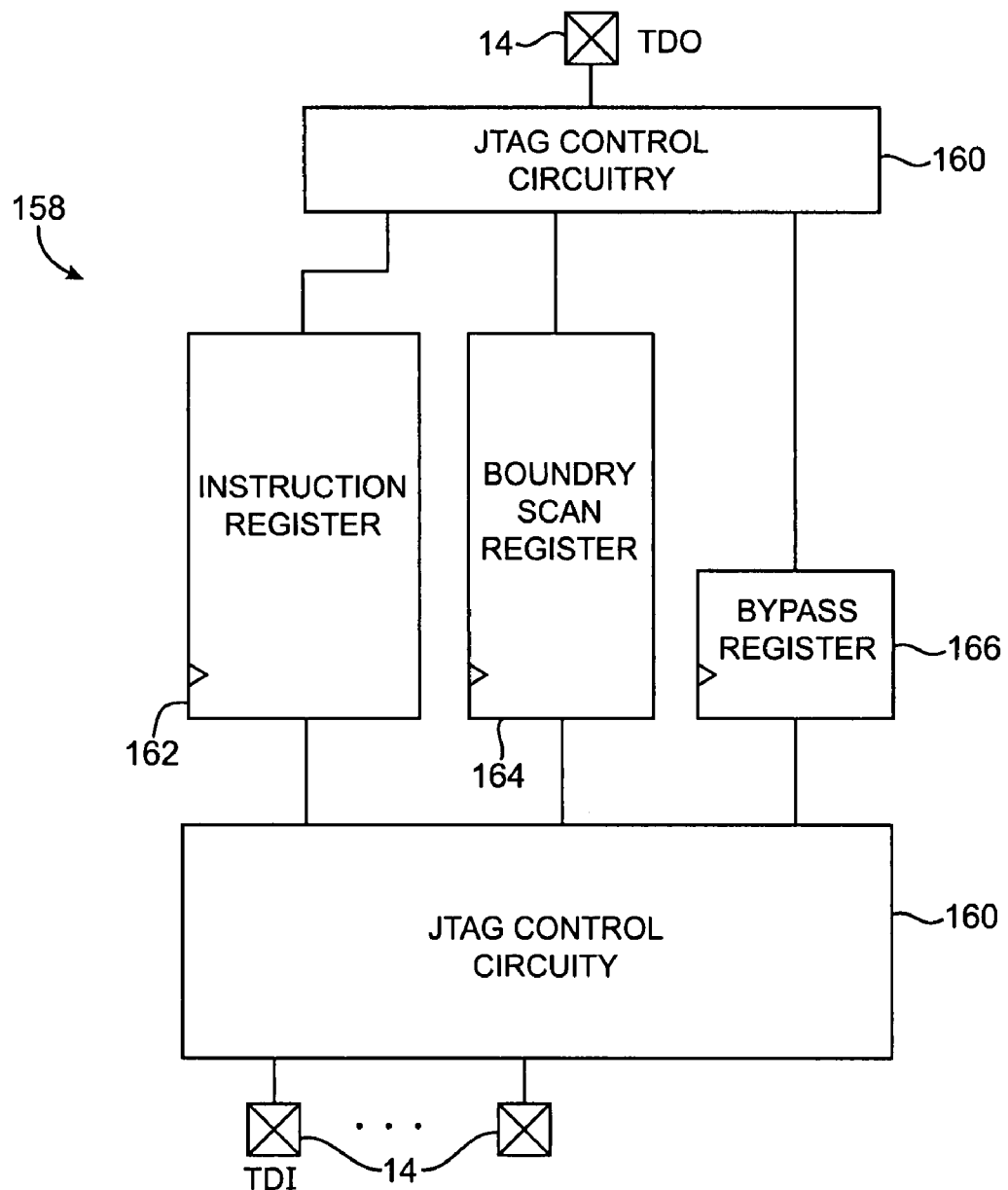
FIG. 9 is a diagram of conventional boundary scan test circuitry that is compliant with JTAG (Joint Test Action Group) standards.

Boundary scan testing is typically performed using circuitry that is compliant with the Joint Test Action Group (JTAG) standards. The JTAG standards define a set of test instructions that can be used to control operations such as loading test vectors into boundary scan registers and unloading results from boundary scan registers. Conventional JTAG testing circuitry 158 of the type used in conventional mask-programmed programmable logic devices is shown in FIG. 9. As shown in FIG. 9, circuitry 158 includes JTAG control circuitry 160. Circuitry 160 is used to implement a JTAG instruction decoder and JTAG state machine. JTAG instructions are loaded into JTAG instruction register 162. The decoder and state machine in control circuitry 160 respond to the loaded instructions accordingly. Test data loading is accomplished through the TDI pin and boundary scan registers 164. The cells of boundary scan register 164 may be located throughout the device to be tested. If it is desired to bypass register 164 (e.g., for a preliminary test), data can be directed through bypass register 166. Following a test, captured test data is unloaded from boundary scan register 164 through the TDO pin.

During user mode, the signal on line 152 of FIG. 8 is low, so that the high signal on line 154 is applied to all AND gates such as AND gate 132. In user mode, the states of programmable elements such as element 126 therefore determine whether various input-output circuit features are enabled. In test mode, in contrast, the multiplexers 146 are configured to route the test control signals from pins such as pin 148 to gates such as gate 132. The states of the test control signals therefore serve as global signals that can selectively disable various input-output circuit features across the chip. If, for example, it is desired to test the pull-up behavior in each input-output circuit 156 in which the user has implemented this feature, the pull-up test control feature signal is taken high. In those input-output circuits 156 in which the user has set the state of elements such as element 126 high, the pull-up feature will be enabled for testing.

With conventional mask-programmed devices, there is an undesirable coupling between input-output circuit features that places restrictions on how feature tests can be performed. Consider a device in which input-output circuits have both the pull-up feature and the differential input resistor feature. A first pin serves as a test control pin that supplies test control signals that selectively enable the pull-up feature. A second pin serves as a test control pin that supplies test control signals that selectively enable the input resistor feature. In this example, the second pin is contained in an input-output circuit block in which the user has implemented the pull-up feature by mask programming an appropriate programmable element. This arrangement will lead to an undesirable interplay between the features during testing. If the first pin is taken high to enable the pull-up feature, the pull-up circuitry connected to the second pin will pull the second pin high. The second pin serves as the test control pin for the input resistor feature, so when the second pin is pulled high, the input resistor feature will unintentionally be turned on.

Because of this undesirable interplay between features, the conventional testing methodology involves holding all unused test control pins at "0". This prevents pins such as the second pin in the present example from being taken to undesired values. However, because these pins are held at "0", they cannot participate in the test. For example, if the input-resistor feature control pin is held at "0", it will not be possible to monitor the voltage on that pin to attempt to determine whether the pull-up feature for that pin is working. When there are a number of input-output features to be tested, a significant portion of the total number of input-output circuits on the device cannot be tested because the input-output pins associated with those input-output circuits are being used as test control pins.

In accordance with the present invention, mask-programmable devices are provided that contain feature control registers. The feature control register on a device can be loaded with an input-output circuit feature selection instruction (also sometimes called a feature control word or feature selection word). The feature selection instruction preferably includes a global control bit whose value determines whether input-output circuit feature testing is enabled globally on the entire chip. If the value of the global control bit is "0," feature testing is disabled for the entire mask-programmed device. If the value of the global control bit is "1," feature testing is enabled for the entire device.

When feature testing is enabled, the remainder of the bits in the feature selection instruction are used to control which feature or features are active. If, for example, the pull-up feature selection bit is high, the pull-up feature will be tested. If the input resistance bit is high, the input resistor feature will be tested. Features may be tested independently, because the undesirable interplay between features that exists in conventional mask-programmed devices in which input-output pins serve as test control pins is eliminated.

Figure 10:
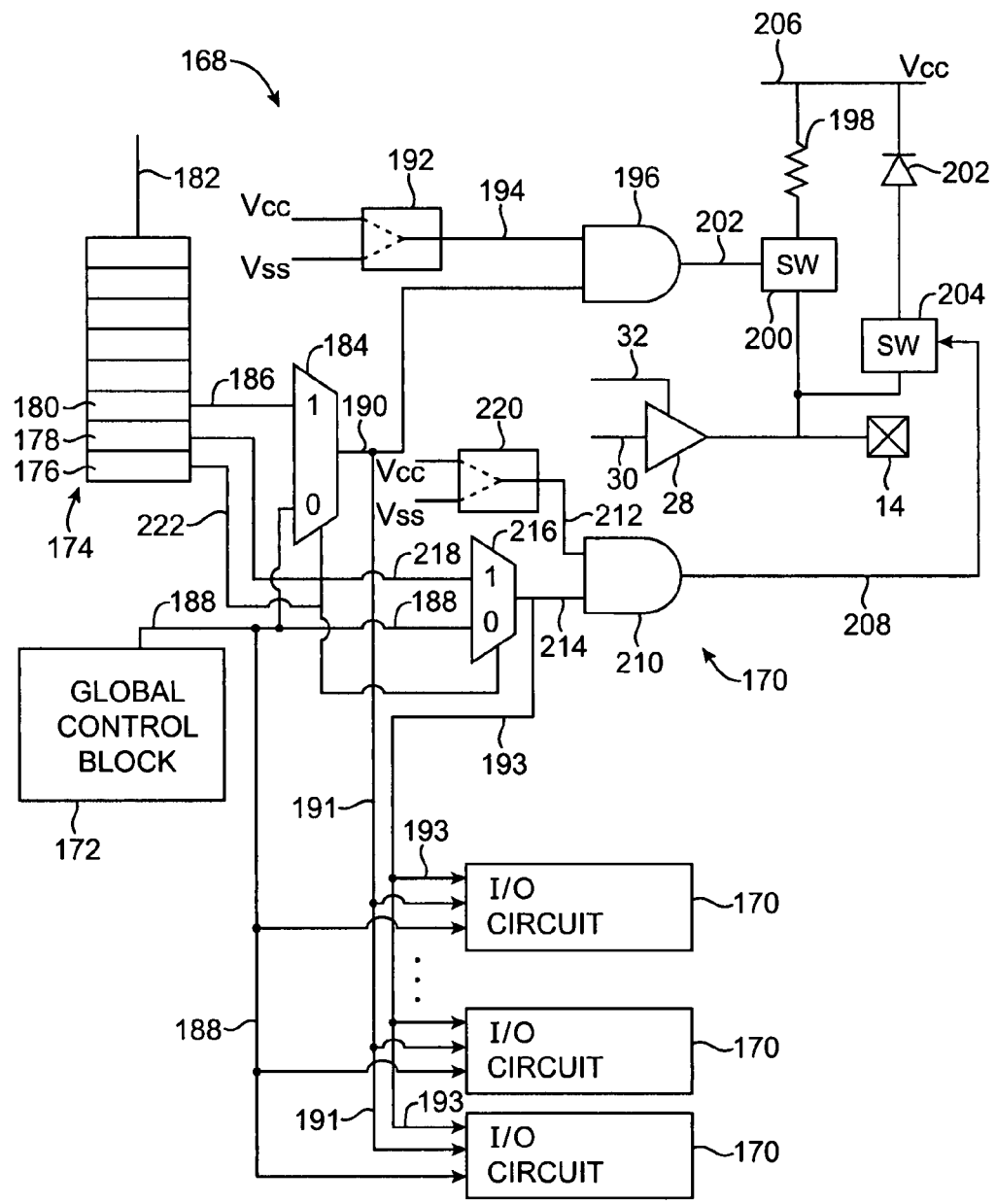
FIG. 10 is a diagram of a portion of a mask-programmable programmable logic device integrated circuit showing test circuitry and input-output circuits in accordance with the present invention.

Circuitry for a mask-programmed integrated circuit device such as a mask-programmed programmable logic device in accordance with the present invention is shown in FIG. 10. Circuitry 168 includes multiple input-output circuits 170. The illustrative input-output circuits 170 of FIG. 10 have two associated input-output circuit features—a pull-up feature implemented using pull-up resistor 198 and switch 200 connected between input-output pin 14 and positive power supply terminal 206 and a voltage clamp diode feature implemented using diode 202 and switch 204. In general, circuits 170 may include any suitable input-output circuit features such as those described in connection with FIGS. 2-5. Switches such as switches 200 and 204 may be implemented using any suitable circuitry. On a typical device, there are 10s or 100s of input-output pins 14 and 10s or 100s of associated input-output circuits 170.

Global control block 172 may be used to handle power-up operations. During testing, global control block 172 provides a global control block enable signal on control line 188. The global control block enable signal is generally a logic high signal (a "1"). This enable signal is applied to the "0" inputs of multiplexers such as multiplexers 184 and 216. In a typical arrangement, there is one multiplexer for each input-output feature to be tested. Any suitable circuitry may be used to implement the switching functions of the circuitry that is shown schematically as multiplexers in FIG. 10.

Each multiplexer has a "1" input that receives a signal from one of the feature selection bits in feature control register 174. In the example of FIG. 10, multiplexer 184 uses path 186 to receive feature selection bit 180. The value of feature selection bit 178 is conveyed to the "1" input of multiplexer 216 via path 218.

Each multiplexer also has a control input. The control inputs of the multiplexers are controlled by the global feature testing control bit 176 via path 222. The global feature testing control bit selectively enables testing. If the value of bit 176 is "0" the multiplexers connect their "0" inputs to their outputs. In this situation, the global control block enable signal is provided to all input-output circuits so that they can be used normally (e.g., during normal user mode operation of the integrated circuit in a system). If the value of bit 176 is "1", the multiplexers connect their "1" inputs to their outputs to enable feature testing.

Register 174 can be loaded with feature selection instructions via data path 182. The values of the bits in the instructions loaded into register 174 provide global feature enable control signals that determine which input-output circuit features in the input-output circuits 170 are enabled for testing. In the example of FIG. 10, bit 178 is associated with the voltage clamp diode feature and bit 180 is associated with the pull-up resistor feature. To test the pull-up feature, an instruction can be loaded into register 174 in which bit 176 is high (to enable testing), bit 178 is low (to disable the voltage clamp feature), bit 180 is high (to enable the pull-up feature), and the remaining bits are low (to disable all other features). To test the voltage clamp diode feature, a different instruction can be loaded into register 174. In this instruction, bit 176 is high (to enable testing), bit 178 is high (to enable the voltage clamp feature), bit 180 is low (to disable the pull-up feature), and the remaining bits are low (to disable all other features). Other configurations are also possible. For example, an instruction can contain multiple "high" feature control bits (e.g., when features do not conflict with one another).

In general, each input-output circuit 170 may contain different user-defined features. For example, one set of the input-output circuits 170 may have the pull-up feature enabled and another set of the input-output circuits 170 may have the voltage clamp diode feature enabled. The logic designer who designs the mask-programmed device makes these decisions during the design phase using a logic design system. The logic design system then creates configuration data to implement the logic designer's design. The configuration data is used to construct a programming mask that, in turn, is used to fabricate the device. The finished device has mask-programmed elements such as elements 192 and 220 whose states (e.g., whether they are connected to a positive power supply voltage Vcc or a ground power supply voltage Vss) are determined by the configuration data. The state of each mask-programmed element determines the value of the mask-programmed static control signal that is provided at its output.

If, for example, element 192 has its output programmed to produce Vss, the pull-up feature for the associated input-output circuit 170 will not be implemented. In this case, the pull-up feature for the input-output circuit 170 that is associated with that element cannot be tested, regardless of the value of the feature selection bit 180. Only features that the logic designer has enabled in a given input-output circuit 170 can be tested in that circuit 170. For example, if element 192 has been mask-programmed to produce a high voltage (Vcc) at its output, the pull-up feature in the circuit 170 associated with element 192 will be enabled and will be available for testing.

AND gates 196 and 210 in each circuit 170 are used to determine which features are enabled. One input to each AND gate is the output of a corresponding mask-programmed element. The other input to each AND gate is the control signal from a corresponding multiplexer.

AND gate 196 has one input that receives the state of mask-programmed element 192 over path 194. AND gate 196 has another input that receives the output of multiplexer 184 over path 190. As shown by path 191, this output signal is distributed globally to other input-output circuits 170 to serve as a global feature enable signal. If global feature testing control bit 176 is high and if the pull-up feature selection bit 180 is high, the signal on line 190 will be high. If the output of element 192 is high because the pull-up feature has been implemented, the corresponding output of AND gate 196 will be high. This high signal is provided to switch 200 over path 202 and turns switch 200 on. With switch 200 on, the pull-up feature is enabled for testing.

AND gate 210 has one input that receives the state of mask-programmed element 220 over path 212. AND gate 210 has another input that receives the output of multiplexer 216 over path 214. As shown by path 193, this output signal is distributed globally to other input-output circuits 170 and serves as a global feature enable signal for the voltage clamp feature. If global feature bit 176 is high and if the voltage clamp feature selection bit 178 is high, the signal on line 214 will be high. If the output of element 220 is high because the voltage clamp feature has been implemented, the corresponding output of AND gate 210 will be high. The high output signal from gate 210 is provided to switch 204 over path 208 and turns switch 204 on. With switch 204 on, the voltage clamp feature is enabled for testing.

As this example demonstrates, the feature selection instructions loaded into register 174 provide global enable signals for various input-output circuit features. If the feature selection signal for a particular feature is high, that feature can be tested, provided that the input-output circuit 170 in question has been configured to implement that feature by appropriate mask programming of its programmable elements.

In the example of FIG. 10, there is a single global feature testing control bit 176. The state of bit 176 determines whether feature testing is enabled globally (i.e., by enabling feature testing on a global set of all input-output circuits with testable input-output circuit features). If desired, more granularity may be provided by using multiple feature testing control bits. With this type of arrangement, smaller sets (subsets) of input-output circuits can be addressed. For example, when there are two feature testing control bits, a first of the two feature testing control bits can be set to a logic "1" when it is desired to enable feature testing of one half of the input-output circuits on an integrated circuit and a second of the two feature testing control bits can be set to a logic "1" when it is desired to enable feature testing of another half of the input-output circuits on the integrated circuit. The subsets of input-output circuits for which feature testing is enabled in this way need not be mutually exclusive. Moreover, any suitable number of feature testing control bits may be used (e.g., three feature testing control bits, four feature testing control bits, etc.). Using larger numbers of feature testing control bits allows the input-output circuits to be divided into smaller subsets.

The input-output circuit feature selection bits associated with each set of input-output circuits that are enabled by a feature testing control bit can be distinct. For example, if there are two feature testing control bits and two associated subsets of input-output circuits for which feature testing can be enabled, each of the two subsets may have four (or any other suitable number) of associated input-output circuit feature selection bits. One subset can have one number of associated input-output circuit feature selection bits (and features) and the other subset can have another number of associated input-output circuit feature selection bits (and features). Alternatively, both subsets can have the same number of associated input-output circuit feature selection bits. The input-output circuit features controlled by the input-output feature selection bits for each subset may be the same, may overlap, or may be mutually exclusive.

The input-output feature control register 174 can be implemented using any suitable storage elements and may be loaded through any suitable pins. With one illustrative arrangement, the input-output feature control register is formed from a shift register. The shift register contains two parallel registers. Initially, a feature selection instruction is serially loaded into a first register. In a subsequent shift operation, the loaded instruction is transferred in parallel from the first register to a second register.

Figure 11:
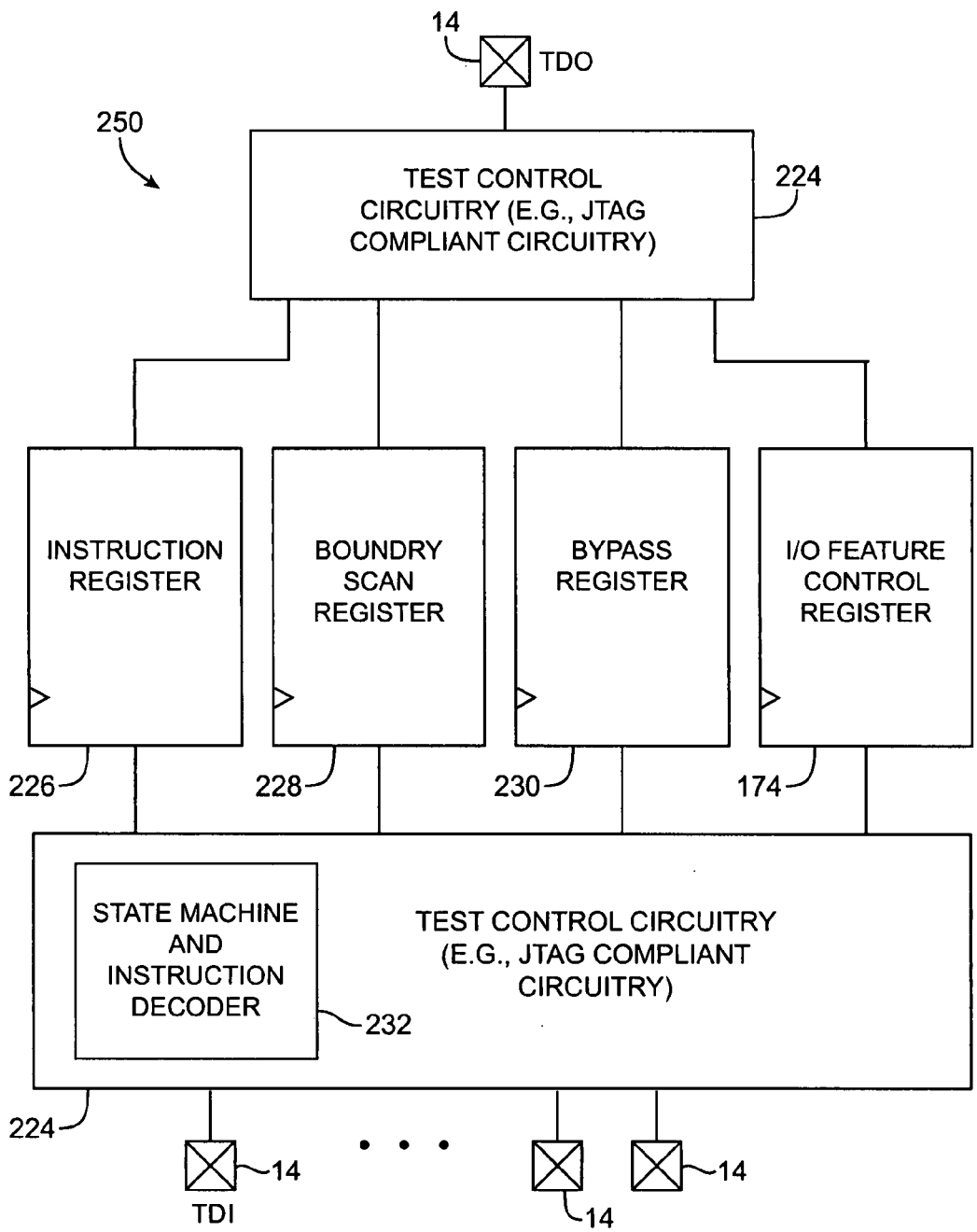
FIG. 11 is a diagram of testing circuitry including boundary scan test circuitry and I/O feature selection circuitry for testing a mask-programmed programmable logic device integrated circuit in accordance with the present invention.

Illustrative testing circuitry 250 that incorporates an I/O feature control register 174 is shown in FIG. 11. Testing circuitry 250 may include test control circuitry 224 for controlling the loading of feature selection instructions into I/O feature control register 174. Feature selection instructions may, for example, be loaded into register 174 through a pin such as a TDI pin or other suitable pin 14. Test control circuitry 224 may, if desired, be compliant with JTAG standards while at the same time providing functions that enable feature selection instructions to be routed to register 174 when desired.

Testing control circuitry 224 may include a state machine and instruction decoder 232 such as a JTAG state machine and JTAG instruction decoder. Instructions are loaded into instruction register 226 and are decoded by instruction decoder 232. The instructions that are decoded by the instruction decoder 232 control the operation of the state machine and are sometimes referred as test control circuitry control instructions. The instruction decoder 232 can include support for test control circuitry instructions that direct testing control circuitry 224 to load feature selection instructions into register 174.

Boundary scan register 228 preferably contains numerous boundary scan cells that form at least one boundary scan chain through the mask-programmed device. Boundary scan register 228 can be loaded with test data when it is desired to place the device in a particular initial state for testing. Functional logic tests and structural tests (i.e., tests of input-output circuit features such as pull-up, voltage clamp, bus hold, input resistance, single-ended/differential, and open drain features) can be performed using the testing data loaded into the boundary scan register 228.

The storage elements in register 228 (which are sometimes called cells or registers) are preferably used to capture signals on certain nodes in the device (e.g., at or near input-output pins, at internal nodes, etc.). In a typical scenario, boundary scan register 228 is loaded with test data through the TDI pin. Corresponding test results are captured using the boundary scan register 228 and are serially unloaded through the TDO pin. In addition to the TDI and TDO pins, other pins 14 may be used to provide information to test control circuitry 224. In general, any suitable number of chains and individual register cells may be included in registers such as register 228 and these chains and registers may be organized in any suitable architecture.

Bypass register 230 may be used when it is desired to transmit data past boundary scan register 228 (e.g., during preliminary testing). The I/O feature control register 174 controls which input-output circuit features are globally enabled, as described in connection with FIG. 10.

During loading, circuitry 224 is used to route data that is provided to pins such as the TDI pin to an appropriate destination (e.g., instruction register 226, boundary scan register 228, bypass register 230, or I/O feature control register 174). During unloading, circuitry 224 is used to route data from these components to an appropriate output (e.g., the TDO pin).

Figure 12:
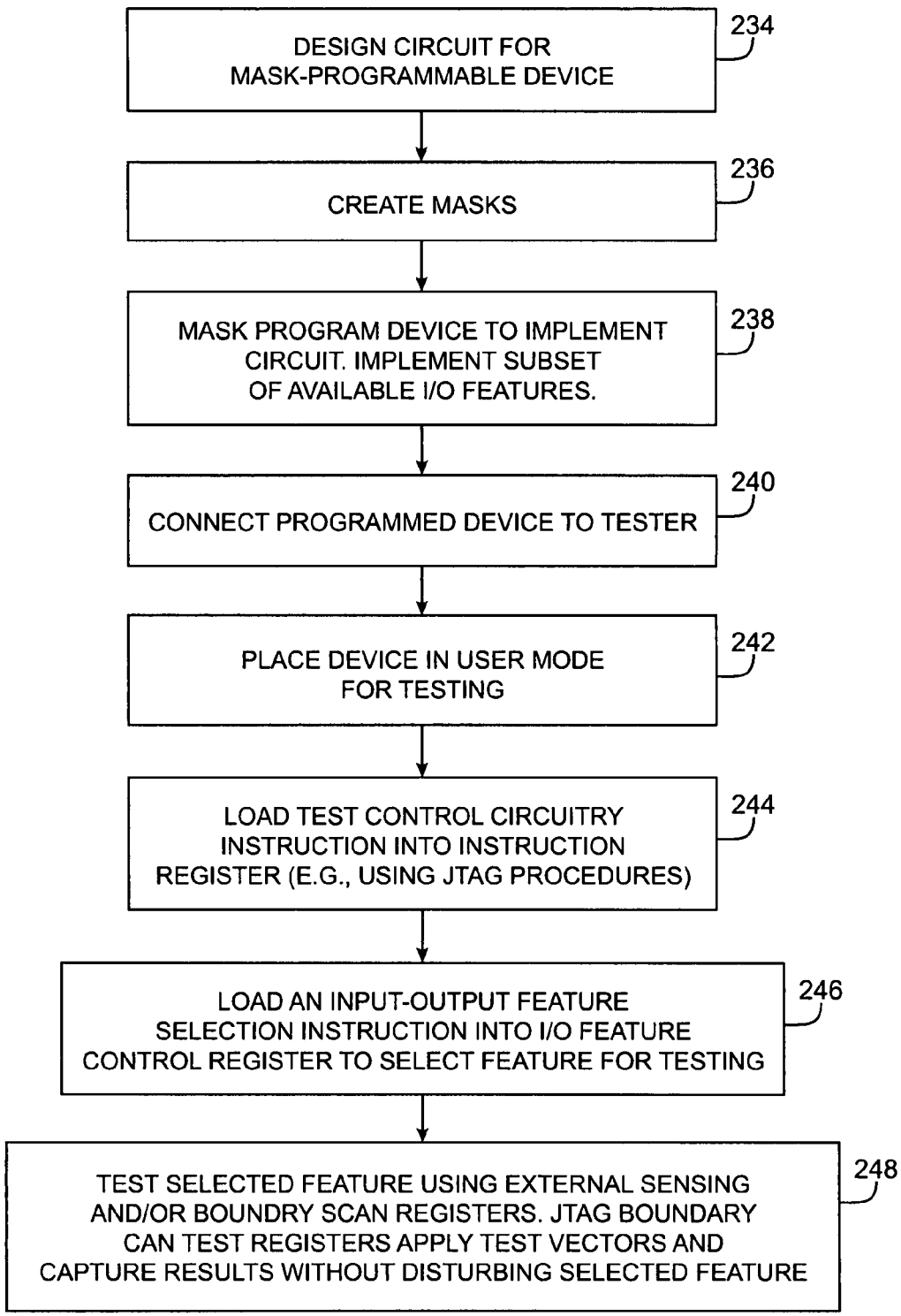
FIG. 12 is a flow chart of illustrative steps involved in testing a mask-programmable programmable logic device integrated circuit in accordance with the present invention.

Illustrative steps involved in using the testing circuitry 250 of FIG. 11 to perform comprehensive structural tests on input-output circuits 170 on a mask-programmed device of the type described in connection with FIGS. 10 and 11 are shown in FIG. 12.

At step 234, a logic designer designs a circuit to be implemented in a mask-programmable device. In a typical scenario, the logic designer uses a logic design system in creating the circuit design. The logic design system converts an abstract definition of the desired circuit into configuration data for programming a mask-programmable integrated circuit such as a mask-programmable programmable logic device integrated circuit.

At step 236, the configuration data that was created at step 234 is used to create one or more lithographic masks for programming the integrated circuit. Masks used for mask-programming are generally much simpler than masks used in traditional ASIC fabrication. For example, the mask that is created at step 236 may include only a pattern of squares. The pattern of squares may define where contact holes are to be formed (e.g., to connect two adjacent metal layers in a dielectric stack). Alternatively, the pattern of squares may define metal connective pads that are used to electrically connect two adjoining conductive lines.

At step 238, the mask that was created at step 236 is used in a semiconductor fabrication process that creates the mask-programmed integrated circuit. Using the mask during semiconductor fabrication is said to "mask-program" the device with the configuration data from step 234. This customizes the device so that the device implements the logic designer's custom circuit design. The device contains numerous input-output circuits such as the input-output circuits of FIGS. 2-5 and 10. In fabricating the device according to the logic designer's design during step 238, the logic designer's selections of input-output circuit features for each input-output circuit on the device are implemented. Only those programmable elements 20 (e.g., elements 192 and 210 of FIG. 10) that are mask-programmed appropriately are able to turn on the associated input-output circuit features in a given input-output circuit.

At step 240, the mask-programmed device may be connected to a tester or may otherwise be installed in a system environment in which testing is to be performed. Testing is typically performed by a tester that is based on a computer or group of computers and that runs a software testing program or suite of testing programs. Testers may make electrical contact with the pins of the test device. Data is loaded into the device from the tester via the pins and is unloaded from the device to the tester via the pins.

Figure 13:
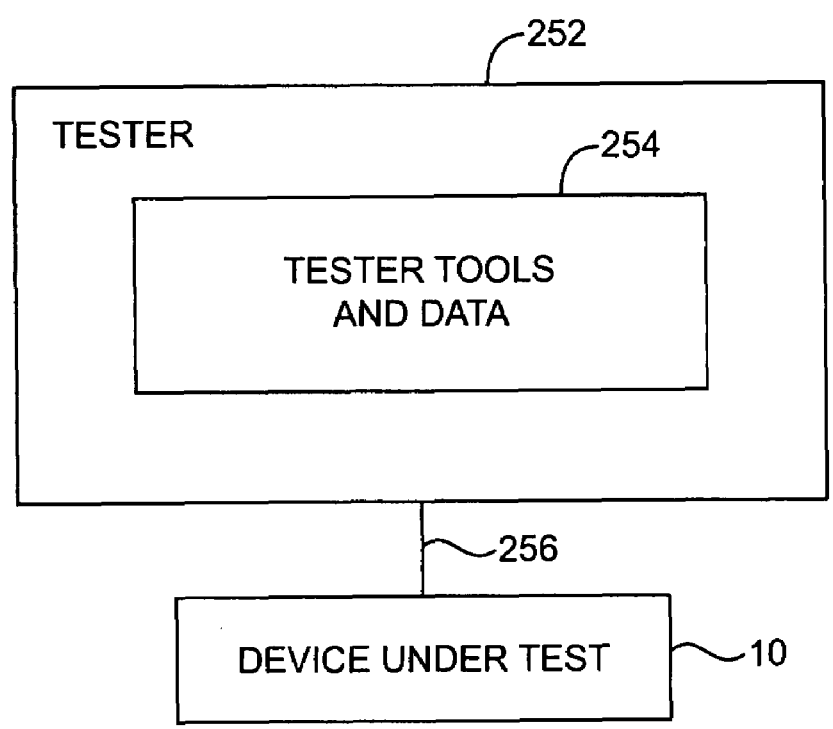
FIG. 13 is a diagram of an illustrative tester and mask-programmed integrated circuit in accordance with the present invention.

A typical testing arrangement is shown in FIG. 13. As shown in FIG. 13, a tester 252 (e.g., a tester implemented on one or more computers) runs testing tools 254 (software) to perform tests on mask-programmed integrated circuit 10. During testing, data is transferred from tester 252 to device 10 over path 256 (e.g., through a probe head or test socket in which device 10 is mounted). Test results are gathered by tester 252 over path 256 for processing. The processed results are displayed to a user (e.g., the logic designer) who evaluates the results to determine whether the device 10 is functioning properly.

During testing, the device may be placed in user mode (step 242 of FIG. 12). During user mode testing, it is not necessary to disable differential input buffers, open-drain features, and other portions of the device, which allows for comprehensive testing. In general, testing can be performed in any suitable mode. After steps 240 and 242 of FIG. 12, control block 172 is generating a logic high signal on output 188 (FIG. 10).

At step 244 of FIG. 12, the test control circuitry 224 (FIG. 11) can be used to load a test control circuitry instruction into instruction register 226. If desired, test control circuitry 224 may be compliant with JTAG standards. If a conventional JTAG instruction is loaded into register 226, the JTAG instruction decoder and state machine will direct the circuitry 250 to take appropriate actions. If, however, the test control circuitry instruction directs the test control circuitry 224 to prepare to receive an input-output feature selection instruction, the input-output feature selection instruction can be loaded into the input-output feature control register 174 at step 246. The input-output feature selection instruction may contain a global control bit whose value determines whether input-output circuit feature testing is enabled. The other bits of the input-output feature selection instruction are feature selection bits that determine which features are enabled for testing, as described in connection with FIG. 10.

At step 248, the input-output circuit feature that has been globally enabled by an associated feature selection bit is tested using the test control circuitry. During testing, test signals are applied using the boundary scan register (chain) and test results are captured by the boundary scan register (chain). The boundary scan operations are performed without disturbing the contents of the input-output feature control register, so that the selected input-output feature(s) is tested properly. Comprehensive testing is accomplished by repeatedly loading fresh input-output feature selection instructions into register 174 and performing additional boundary scan testing.

Test control circuitry 224 may be compatible with conventional JTAG instructions, so that conventional JTAG boundary scan procedures that have been developed for mask-programmed devices without the input-output feature control register 174 can be used during testing. An additional test control circuitry instruction or instructions (which may be JTAG compliant) may be used to control how the test control circuitry operates the input-output feature control register (e.g., to direct the test control circuitry to load the input-output feature selection instruction into input-output feature control register 174 or otherwise handle test functions associated with register 174). Existing JTAG instructions need not be affected by the additional test control circuitry instruction or instructions and can still be used to control the conventional JTAG portion of test control circuitry 244. This allows the invention to be implemented without disturbing existing JTAG testing arrangements and allows JTAG boundary scan testing techniques to be used during feature testing with register 174.

The foregoing testing arrangements have sometimes been described in the context of mask-programmable programmable logic device integrated circuits. This is merely illustrative. In general, the invention applies to the testing of input-output circuit features on any suitable integrated circuit.

The foregoing is merely illustrative of the principles of this invention and various modifications can be made by those skilled in the art without departing from the scope and spirit of the invention.

What is claimed is:

1. A method for testing input-output circuit features on an integrated circuit, comprising:
    loading an input-output circuit feature selection instruction into the integrated circuit;
    in response to the loaded input-output circuit feature selection instruction, selectively enabling at least one input-output circuit feature in a plurality of input-output circuits on the integrated circuit; and
    testing the enabled input-output circuit feature.

2. The method defined in claim 1 wherein the integrated circuit comprises a mask-programmed integrated circuit and wherein the input output circuit feature is selected from the group consisting of: a pull-up resistance feature, a voltage clamp feature, a single-ended/differential feature, a differential input resistance feature, a bus hold feature, and an open-drain feature, the method further comprising testing the enabled input-output circuit feature by serially loading test data onto the input-output circuit through at least one pin.

3. The method defined in claim 1 wherein loading the input-output circuit feature selection instruction comprises loading an input-output circuit feature selection instruction that contains at least one feature testing control bit whose value determines whether input-output circuit feature testing is enabled in a set of the input-output circuits.

4. The method defined in claim 1 wherein loading the input-output circuit feature selection instruction comprises loading an input-output feature selection instruction that contains a plurality of input-output circuit feature selection bits, each of which controls whether a respective input-output circuit feature is enabled for testing in a set of the input-output circuits.

5. The method defined in claim 1 wherein loading the input-output circuit feature selection instruction comprises loading an input-output circuit feature selection instruction that contains a global feature testing control bit whose value determines whether input-output circuit feature testing is enabled globally on the entire integrated circuit and at least one input-output circuit feature selection bit that is associated with a given input-output circuit feature.

6. The method defined in claim 1 wherein the integrated circuit comprises a mask-programmed integrated circuit, wherein loading the input-output circuit feature selection instruction comprises loading an input-output circuit feature selection instruction that contains a plurality of input-output circuit feature selection bits, each of which controls whether a respective input-output circuit feature is globally enabled for testing on the integrated circuit, wherein the instruction contains a global feature testing control bit, and wherein one of the input-output circuit feature selection bits is an open-drain feature selection bit.

7. The method defined in claim 1 wherein the integrated circuit comprises an input-output circuit feature control register and wherein loading the input-output feature selection instruction into the mask-programmed integrated circuit comprises using a tester to serially load the input-output circuit feature selection instruction into the input-output circuit feature control register.

8. The method defined in claim 1 wherein the integrated circuit comprises test control circuitry that includes an instruction register, a boundary scan register, and an input-output circuit feature control register, the method further comprising loading a test control circuitry instruction into the instruction register that controls how the test control circuitry operates the boundary scan register.

9. The method defined in claim 1 wherein the integrated circuit comprises test control circuitry that includes an instruction register, a boundary scan register, and an input-output circuit feature control register, the method further comprising loading a test control circuitry instruction into the instruction register that controls how the test control circuitry operates the input-output circuit feature control register.

10. The method defined in claim 1 wherein the integrated circuit comprises test control circuitry compliant with JTAG standards that includes an instruction register, a boundary scan register, and an input-output circuit feature control register, the method further comprising loading a JTAG test control circuitry instruction into the instruction register that controls how the test control circuitry operates the boundary scan register.

11. The method defined in claim 1 wherein the integrated circuit comprises test control circuitry compliant with JTAG standards that includes an instruction register, a boundary scan register, and an input-output circuit feature control register, the method further comprising loading JTAG test control circuitry instructions into the instruction register and using test control circuitry instructions loaded into the instruction register in determining how the test control circuitry operates the boundary scan register and input-output feature control register during testing of the integrated circuit.

12. The method defined in claim 1 wherein the integrated circuit comprises a mask-programmed integrated circuit, the method further comprising performing boundary scan testing on the integrated circuit while testing the enabled input-output circuit feature.

13. The method defined in claim 1 further comprising performing JTAG-compliant boundary scan testing on the integrated circuit while testing the enabled input-output circuit feature.

14. Circuitry for testing a plurality of different input-output circuit features in a plurality of input-output circuits on a mask-programmed programmable logic device comprising:
 a plurality of mask-programmed programmable elements, each associated with one of the input-output circuits, wherein each mask-programmed programmable element provides a mask-programmed static control signal;
 a plurality of multiplexers, wherein there is a multiplexer associated with each of the plurality of input-output circuit features and wherein each multiplexer has first and second inputs, an output, and a control terminal;
 a global control block that provides a global control block enable signal to the first input of each of the multiplexers;
 an input-output feature control register that provides a plurality of feature selection bits each of which is associated with a respective one of the input-output circuit features, wherein each feature selection bit is provided to a respective one of the multiplexers at that multiplexer's second input, wherein the input-output feature control register provides a global feature testing control bit to the control terminals of the multiplexers that selectively enables feature testing by connecting the second input of each multiplexer to its output so that the feature selection bit provided to that multiplexer is provided at its output; and
 a plurality of logic gates each of which has first and second inputs and an output and each of which is associated with one of the input-output circuits, wherein each logic gate receives the mask-programmed static control signal of one of the mask-programmed programmable elements at its first input and receives one of the feature selection bits from the output of one of the multiplexers at its second input and wherein the output of each logic gate controls a respective one of the input-output circuit features in the input-output circuit associated with that logic gate.

15. The circuitry defined in claim 14 wherein the input-output circuit features include a pull-up feature, the circuitry further comprising:
 a switch in each input-output circuit that is responsive to the output of a given logic gate in that input-output circuit to selectively enable the pull-up feature.

16. The circuitry defined in claim 14 wherein the input-output circuit features include a pull-up feature and wherein one of the feature selection bits provided by the input-output feature control register is a pull-up feature selection bit, the circuitry further comprising:
 a switch in each input-output circuit that is responsive to the output of a given logic gate in that input-output circuit to selectively enable the pull-up feature in that input-output circuit when the global feature testing control bit applied to the control terminals of the multiplexers has enabled feature testing by connecting the second input of each multiplexer to its output and the pull-up feature selection bit is high.

17. The circuitry defined in claim 14 wherein the input-output circuit features include a voltage clamp feature and wherein one of the feature selection bits provided by the input-output feature control register is a voltage clamp feature selection bit, the circuitry further comprising:
 a switch in each input-output circuit that is responsive to the output of a given logic gate in that input-output circuit to selectively enable the voltage clamp feature in that input-output circuit when the global feature testing control bit applied to the control terminals of the multiplexers has enabled feature testing by connecting the second input of each multiplexer to its output and the voltage clamp feature selection bit is high.

18. The circuitry defined in claim 14 wherein the input-output circuit features include a voltage clamp feature, a pull-up feature, and a bus hold feature and wherein the feature selection bits provided by the input-output feature control register include a voltage clamp feature selection bit, a pull-up feature selection bit, and a bus hold feature selection bit, the circuitry further comprising:
 switches in each input-output circuit that are responsive to the outputs of respective logic gates in that input-output circuit to selectively enable the voltage clamp feature, the pull-up feature, and the bus hold feature, wherein the voltage clamp feature is enabled in that input-output circuit when the global feature testing control bit applied to the control terminals of the multiplexers has enabled feature testing by connecting the second input of each multiplexer to its output and the voltage clamp feature selection bit is high, wherein the pull-up feature is enabled in that input-output circuit when the global feature testing control bit applied to the control terminals of the multiplexers has enabled feature testing by connecting the second input of each multiplexer to its output and the pull-up feature selection bit is high, and wherein the bus hold feature is enabled in that input-output circuit when the global feature testing control bit applied to the control terminals of the multiplexers has enabled feature testing by connecting the second input of each multiplexer to its output and the bus hold feature selection bit is high.

19. A mask-programmable integrated circuit containing a plurality of input-output circuits each of which has a plurality of associated input-output circuit features, comprising:

a plurality of mask-programmed programmable elements associated with each input-output circuit, wherein for each input-output circuit, each of the mask-programmable programmable elements has an output that is used to selectively enable a respective input-output circuit feature in that input-output circuit; and an input-output feature control register that is loaded with input-output feature selection bits during testing of the integrated circuit device to control which of the input-output circuit features are globally enabled for testing.

20. The mask-programmed integrated circuit defined in claim 19 further comprising:

a boundary scan register that captures test results while the feature control register is loaded with at least one high input-output feature selection bit during testing.

* * * * *